United States Patent [19] [11] 4,165,249
Heywang [45] Aug. 21, 1979

[54] METHOD OF PURIFYING GERMANIUM BODIES

[75] Inventor: Walter Heywang, Neukeferloh, Fed. Rep. of Germany

[73] Assignee: Siemens Aktiengesellschaft, Berlin & Munich, Fed. Rep. of Germany

[21] Appl. No.: 772,100

[22] Filed: Feb. 25, 1977

[30] Foreign Application Priority Data

Feb. 26, 1976 [DE] Fed. Rep. of Germany ....... 2607911

[51] Int. Cl.$^2$ .............................................. B01J 12/17
[52] U.S. Cl. .................................... 156/605; 156/620; 156/DIG. 66; 148/191
[58] Field of Search ................... 156/605, 617 R, 620, 156/DIG. 66, DIG. 67, 609, 610, 613; 252/181.1, 184, 62.3 E; 75/66 ZM; 148/176, 191

[56] References Cited

U.S. PATENT DOCUMENTS

| 2,739,088 | 3/1956 | Pfann | 252/62.3 E |
| 3,047,380 | 7/1962 | Bloem | 75/65 ZM |
| 3,102,828 | 9/1963 | Courvoisier | 156/609 |
| 3,162,526 | 12/1964 | Vanik | 75/65 ZM |
| 3,285,017 | 11/1966 | Henderson et al. | 252/62.3 E |
| 3,671,330 | 6/1972 | Hall | 148/1.6 |
| 4,000,020 | 12/1976 | Gartman | 156/610 |

OTHER PUBLICATIONS

Haller et al., IEEE Transactions on Nuclear Science, vol. NS-23, No. 1, Feb. 1976.

Primary Examiner—Hiram H. Bernstein
Attorney, Agent, or Firm—Hill, Van Santen, Steadman, Chiara & Simpson

[57] ABSTRACT

A germanium body containing impurities therein, such as B or Al is provided with a layer of a gettering material such as pure Si or SiO$_2$, along at least one surface of the body, a melt zone is generated about the so-coated body and passed a number of times from one end of the body to the other whereby the gettering material binds the impurities within the germanium body and complex-impurity compounds accumulate at the respective ends of the body. After a desired degree of purity is achieved, the melt zone is deenergized and the impurity-containing ends are severed from the remaining body portion and any excess gettering material is removed.

13 Claims, 1 Drawing Figure

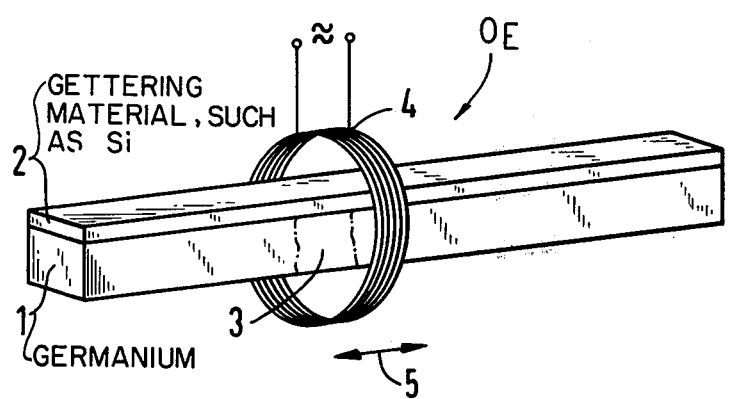

METHOD OF PURIFYING GERMANIUM BODIES

BACKGROUND OF THE INVENTION

1. Field of the Invention

The invention relates to purification of germanium bodies and somewhat more particularly to a process of purifying germanium bodies via a gettering technique.

2. Prior Art

In semiconductor technology, particularly in radiation measurement technology, germanium in its purest form is required. Any impurity having a doping effect on germanium must be at a minimum within any germanium body used in such technology. In this regard, the desired degree of purity is a germanium body having less than 1 impurity atom per a minimum of $10^{10}$ and more preferably per $10^{11}$ or $10^{12}$ germanium atoms. A suitable purification process yielding such results is the zone melt process. This process is based on the fact that when a melt of germanium solidifies, any impurity atoms within the molten germanium pass into the solid state either earlier or later than the pure germanium atoms. The ratio of the amount of impurities in the solidified material to the amount of impurities in the melt is defined as the segregation constant of the impurity involved. During a zone melt process wherein a melt zone passes through a semiconductor body having, for example, the form of a rod, impurities which have a segregation constant greater than 1 accumulate in the rod section which has resolidified after passage of the melt zone while impurities which have a segregation constant less than 1 accumulate within the melt zone. By repeatedly passing a melt zone through a semiconductor rod one is able to collect or segregate impurities having a segregation constant greater than 1 at one end of the rod and collect impurities having a segregation constant less than 1 at the opposite end of the rod. After a desired degree of purity is achieved, the rod ends, which now contain a concentration of impurities, may be severed from the main body of the rod. In order to achieve a sufficiently high degree of purity, the above process steps may be repeated a plurality of times.

During purification of germanium, the removal of aluminum and boron impurities are particularly troublesome because these elements do not appear to obey the above discussed general principles. Thus, a germanium body which was zone purified in this manner within a quartz crucible has a generally uniform high aluminum and boron concentration along the zone purified portions of the germanium body, despite the fact that aluminum has a segregation constant of 0.073 and boron has a segregation constant of 17, both of which are far removed from 1. This abnormal behavior may be explained by the fact that impurities form complex compounds, for example, with oxygen, and these compounds have a completely different segregation constant than atomic aluminum and/or boron. It is known that aluminum-oxygen complex compound formation may be prevented by providing a high concentration (at least about $10^{17}$ atoms per cubic centimeter) of silicon within the germanium body being purified (compare a lecture given by E. E. Haller, W. L. Hansen, G. S. Hubbard and S. S. Goulding at The Nuclear Science Symposium on Nov. 19-21, 1975 in San Francisco, California). However, for most types of applications, germanium must be substantially free of silicon. Thus, intermixing a high concentration of silicon into a germanium body to be zone purified in order to prevent formation of complex aluminum and/or boron compounds is not practical, nor typically utilized.

SUMMARY OF THE INVENTION

The invention provides a method of zone purifying germanium bodies whereby impurities, particularly aluminum and/or boron, are removed from the germanium body.

In accordance with the principles of the invention, impurities which tend to form complex compounds within molten germanium and which tend to segregate very poorly in molten germanium are segregated at select portions of a processed germanium body by applying a layer of a relatively pure gettering material, which prevents formation of complex impurity compounds onto the germanium body before melting the body.

In certain embodiments of the invention, a zone melt process is utilized so that the melt zone passes through the germanium body having a layer of gettering material thereon in such a way that the melt zone borders on the solid gettering material layer. Preferred gettering materials are pure silicon and silicon dioxide.

BRIEF DESCRIPTION OF THE DRAWINGS

The single FIGURE is a somewhat schematic view of a germanium body being processed in accordance with the principles of the invention.

DESCRIPTION OF THE PREFERRED EMBODIMENTS

The invention provides a method of purifying germanium bodies of impurities which tend to form complex compounds within molten germanium and which resist segregation or tend to segregate very poorly in molten germanium.

In accordance with the principles of the invention, germanium bodies are purified by a sequence of melting and solidification, such as in a zone melt process, whereby the purification effect of an individual melting and solidification process is amplified or first made possible and during which the germanium body is not contaminated by additions of extraneous materials or by forming admixtures of germanium with some other material detracting from germanium usage.

In accordance with the principles of the invention, a germanium body having impurities therein which tend to form complex compounds within molten germanium and which tend to segregate very poorly within molten germanium, such as Al and/or B, are segregated at select portions of a processed germanium body by applying a layer of a gettering material, which prevents the formation of complex impurity compounds, onto at least one axially extending surface of the body being purified before melting the germanium body and then generating a germanium melt on such body and allowing the melt to resolidify whereby the impurity atoms become bound to the gettering material atoms and concentrate about the gettering material. After the desired degree of germanium purity is achieved, the gettering material is removed from the processed germanium body, along with the impurities.

The invention is particularly useful in purifying germanium bodies of aluminum and/or boron impurities because the segregation behavior of such impurities is improved by suppressing formation of complex Al and-/or B compounds by a gettering process. The gettering process may either cause the complex impurity compounds per se to become bound to the gettering material or the formation of such complex impurity compounds may be greatly reduced by the gettering material which may shift the controlling chemical equilibrium. In accordance with the invention, such gettering effect occurs even when the gettering material is present as a solid at an edge or surface of a germanium melt because a sufficiently large atom transport takes place between the liquefied (molten) germanium and the bordering gettering material. Such atom transport mechanism allows the atoms within the germanium melt which form the undesired complex impurity compounds to contact the gettering material and be rendered harmless thereby.

In an exemplary embodiment of the invention, molten germanium is brought into contact with the layer of silicon or silicon dioxide because the formation of complex aluminum and/or boron compounds is hindered in the presence of silicon. Because a sufficient atom exchange takes place between the melt and a bordering solid layer of silicon or silicon dioxide, the undesired formation of complex oxygen-aluminum and/or boron compounds is suppressed, for example, by an increased formation of aluminum or boron silicates, or by formation of compounds containing OH groups.

In certain embodiments of the invention, the gettering material is applied onto a germanium body to be purified and then such body is subjected to zone melting. In this process, the purification effect of the zone melting is amplified or first made possible by the gettering material and such impurities which are not bound by the getter matterial are also removed in a conventional manner via the zone melting process.

In purifying germanium of aluminum and/or boron, silicon and/or silicon dioxide are especially good gettering materials. Selected gettering materials must, in the practice of the invention, be applied onto a germanium body in an extremely pure form so that, for example, impurities cannot pass into the germanium body from the gettering material itself. A layer of extremely pure silicon may be applied onto a germanium body via a CVD process (chemical vapor deposition process) at a temperature which is only slightly below the melting temperature of germanium. In instances where silicon dioxide is the select gettering material, it may be applied as such or a layer of silicon may be deposited on the germanium body and then be at least partially oxidized to silicon dioxide by heating the body in the presence of oxygen.

Referring now to the drawing, a germanium body 1, having Al-impurities in a concentration of about $10^{14}$ cm$^{-3}$ for example, comprised of a parallel piped bar or the like, is provided with a an extended continuous layer 2 of a gettering material, such as silicon which may be applied in extremely pure form by depositing silicon on a surface of the body 1 in vacuum via the CVD process (chemical vapor deposition of pyrolytic deposition) at a temperature of about 900° C. In a preferred embodiment of the invention, the applied gettering layer 2 has a thickness of at least 10 μm. The germanium body 1 carrying a gettering layer 2 thereon is then placed in an operational environment $O_E$, which may include support means for the body being processed, a suitable gaseous environment, such as an inert gas, about the body, means for generating a melt on the body, means for effecting relative movement between the melt and the body, etc., all of which are more or less conventional in the art. In the embodiment shown, a high frequency coil 4 connected to a suitable energy source is positioned about the body and upon energization generates a relatively narrow melt zone 3 on the body 1. The high frequency coil 4 may be reciprocally moved along the length of the body 1, as schematically indicated by the double-headed arrow 5 so that the melt zone 3 traverses the length of the body. The zone melting of the germanium body 1 may be repeated as often as necessary to achieve a desired degree of purity in the germanium. During this process, any silicon which passes into the germanium body accumulates, together with the impurities, at the respective ends of the germanium body. This process may be repeated as often as necessary to achieve a desired degree of purity in the germanium, for example 20 times to reach a purity of one impurity atoms per at least $10^{12}$ germanium atoms. After completion of the zone melt process, any silicon remaining on the surface of the germanium body is removed therefrom, for example, by grinding. Similarly, the respective body ends may be removed from the main body portion which is now composed of pure or relatively pure germanium. By this method an impurity concentration of $10^{10}$ cm$^{-3}$ and less has been realized.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as it is set forth and defined in the hereto-appended claims.

I claim as my invention:

1. A process of purifying a germanium body containing impurities therein which form complex compounds in liquid germanium and tend to sergregate relatively poorly in such liquid germanium, comprising:
    applying an extended continuous layer of a relatively pure gettering material which tends to prevent formation of complex impurity compounds onto a surface extending substantially the entire axial length of a germanium body to be purified;
    melting and solidifying at least said germanium so that at least some impurities therein are bound to said gettering material and until a desired degree of germanium purity is attained; and
    removing at least the layer of gettering material from the so-processed germanium body.

2. A process as defined in claim 1 wherein said melting and solidifying of said germanium occurs via a zone melt process whereby a melt zone is generated on at least one end of said germanium body and said melt zone is passed along said body to the other end thereof.

3. A process as defined in claim 2 wherein said melt zone is passed through the germanium body in such a manner that the melt zone borders on the layer of gettering material.

4. A process as defined in claim 2 wherein said melt zone is passed a plurality of time along said germanium body.

5. A process as defined in claim 1 wherein the gettering material is relatively pure silicon.

6. A process as defined in claim 5 wherein the pure silicon layer is applied onto the germanium body via a CVD process.

7. A process as defined in claim 1 wherein the gettering material is relatively pure silicon dioxide.

8. A process as defined in claim 1 wherein a layer of relatively pure silicon is applied onto the germanium body and at least a portion of such silicon layer is oxidized to silicon dioxide by heating the silicon layer in the presence of oxygen.

9. A process of purifying a germanium body containing an impurity selected from the group consisting of Al and B, comprising:

applying a solid extended continuous layer of an impurity gettering material selected from the group consisting of silicon and silicon dioxide onto at least one axially extending surface of said germanium body;

generating a melt zone about the germanium body and moving said melt zone a plurality of times from one end of the germanium body to the other until a desired degree of germanium purity is attained; and removing the germanium body ends and the layer of gettering material from the so-processed body.

10. A process as defined in claim 9 wherein the layer of gettering material remains solid when the melt zone is generated on the germanium body carrying such layer and remains solid while the melt zone is passed through the germanium body.

11. A process as defined in claim 9 wherein the body ends and the layer of gettering material is removed from the so-processed body via grinding.

12. A process as defined in claim 9 wherein the applied layer of gettering material has a thickness of at least about 10 $\mu$m.

13. A process as defined in claim 9 wherein the gettering material is silicon and a solid layer of such gettering material is applied onto at least one surface of the germanium body by vapor depositing in vacuum relatively pure silicon on the gettering body at a temperature of about 900° C.

* * * * *